(12) United States Patent
Fan et al.

(10) Patent No.: US 7,789,672 B2
(45) Date of Patent: Sep. 7, 2010

(54) SOCKET WITH POSITION CLUMPS

(75) Inventors: Chia-Wei Fan, Tu-cheng (TW); Nan-Hung Lin, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/313,762

(22) Filed: Nov. 24, 2008

(65) Prior Publication Data
US 2010/0130031 A1  May 27, 2010

(30) Foreign Application Priority Data
Jun. 16, 2008  (TW) .............................. 097210595

(51) Int. Cl.
*H01R 12/00* (2006.01)

(52) U.S. Cl. ........................................ 439/71; 439/526
(58) Field of Classification Search ................... 439/71, 439/68, 525, 526
See application file for complete search history.

(56) References Cited

U.S. PATENT DOCUMENTS

| | | | | |
|---|---|---|---|---|
| 4,846,703 A | * | 7/1989 | Matsuoka et al. | 439/71 |
| 4,973,255 A | * | 11/1990 | Rudoy | 439/157 |
| 5,106,309 A | * | 4/1992 | Matsuoka et al. | 439/71 |
| 5,154,619 A | * | 10/1992 | Matsuoka | 439/72 |
| 5,493,237 A | * | 2/1996 | Volz et al. | 324/754 |
| 6,544,044 B2 | * | 4/2003 | Akasaka | 439/71 |
| 6,626,682 B2 | * | 9/2003 | Sausen | 439/70 |
| 7,008,237 B1 | | 3/2006 | Ma et al. | |
| 7,151,368 B2 | * | 12/2006 | Joung et al. | 324/158.1 |
| 2006/0105608 A1 | * | 5/2006 | Ma | 439/331 |

* cited by examiner

*Primary Examiner*—Tho D Ta
*Assistant Examiner*—Travis Chambers
(74) *Attorney, Agent, or Firm*—Andrew C. Cheng; Wei Te Chung; Ming Chieh Chang

(57) ABSTRACT

A socket adapted for electrically connecting a semiconductor package to a printed circuit board, comprises an insulating body and a plurality of position clump. The insulating body has a plurality of sidewalls, which define a plurality of assembling slots. The position clumps are movably assembled to the assembling slots of the insulating housing, each of the position clump has a position block and a spring member disposed between the position block and the insulating housing, the position block has a supporting face for supporting the IC package and is able to downwardly move toward the mating face of insulating housing.

16 Claims, 6 Drawing Sheets

SOCKET WITH POSITION CLUMPS

BACKGROUND OF THE INVENTION

1. Field of the Invention

The present invention relates to a socket, especially to a socket electrically connecting a semiconductor package and a printed circuit board.

2. Description of the Related Art

Electrical connector used for electrically connecting semiconductor package usually comprises an insulating housing accommodating with a plurality of terminals, a stiffener surrounding the insulating housing, a loading plate and a lever. The loading plate and the lever are assembled to two opposite ends of the insulating housing and together retain the semiconductor package in the insulating housing. The insulating housing has a conduct area at a middle part thereof and a plurality sidewalls higher than a top surface of the conductive area at a peripheral thereof, the terminals are located in the conductive area and protrude beyond the top surface of the conductive area.

U.S. Pat. No. 7,008,237 discloses a socket for electrically connecting with an IC package, which comprises an insulating housing and a plurality of terminals assembled on the insulating housing, the insulating housing defines a first surface and a second surface. A plurality of contact receiving passageway are defined between the first surface and the second surface, each terminal has an elastic portion extending beyond the first surface of the insulating housing from the contact receiving passageway, the elastic portion is further disposed with a contacting portion for electrically contacting the IC package. Furthermore, the first surface has at least one projection, which defines a supporting surface for supporting the IC package. The supporting surface is higher than the contacting portion in a direction vertical to the first surface, so the terminal can be prevented from bending or deformation when the socket is crushed by outside objector. However, when the IC package is mounting to the socket, one end of the IC package firstly inserts into the socket and the opposite end is then pressed into the socket, since the IC package aslant inserts into the socket, so the terminals in different positions along a direction from the firstly inserting end to the opposite end of the IC package are pressed by different forces, that may destroy the terminals. Furthermore, when the opposite end of the IC package downwardly moves to position the IC package, the terminals located under the firstly inserting end of the IC package are easily pressed and destroyed by the IC package.

Hence, it is required to improve the disadvantages of the above socket.

SUMMARY OF THE INVENTION

An object of the invention is to provide a socket which can protect the contact when the IC package inserts into the socket.

To achieve the above-mentioned object, a socket adapted for electrically connecting a semiconductor package, comprises an insulating housing and a plurality of separate position clumps. The insulating body has a mating face, a mounting face opposite to the mating face and a plurality of sidewalls upwardly extending from the mating face, and the sidewalls define a plurality of assembling slots. The position clumps are movably assembled to the assembling slots of the insulating housing, each of the position clump has a position block and a spring member disposed between the position block and the insulating housing, the position block has a supporting face for supporting the IC package and is able to downwardly move toward the mating face by being pressed.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
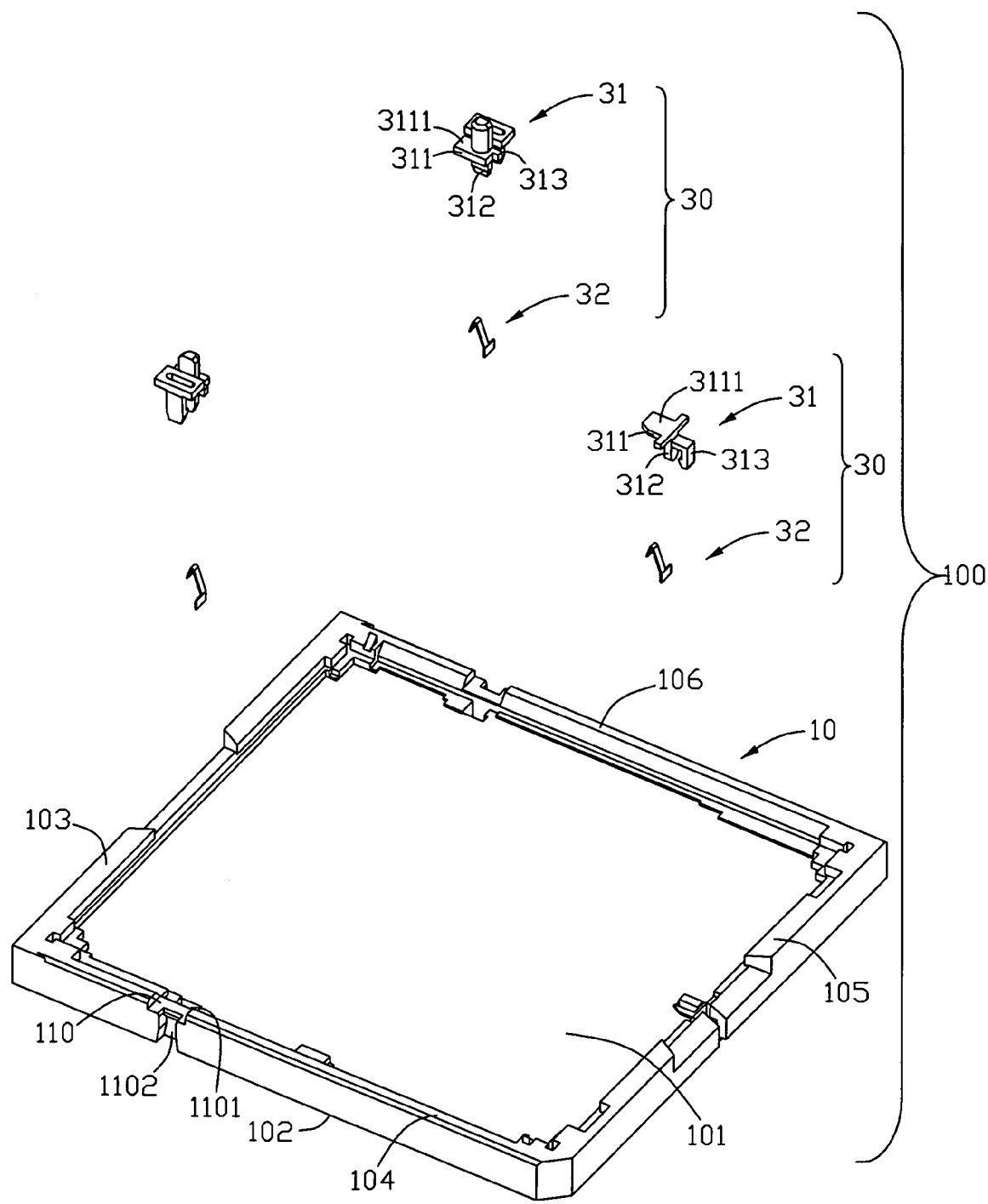
FIG. 1 is an exploded, perspective view of a socket in accordance with a preferred embodiment of present invention.
Figure 5:
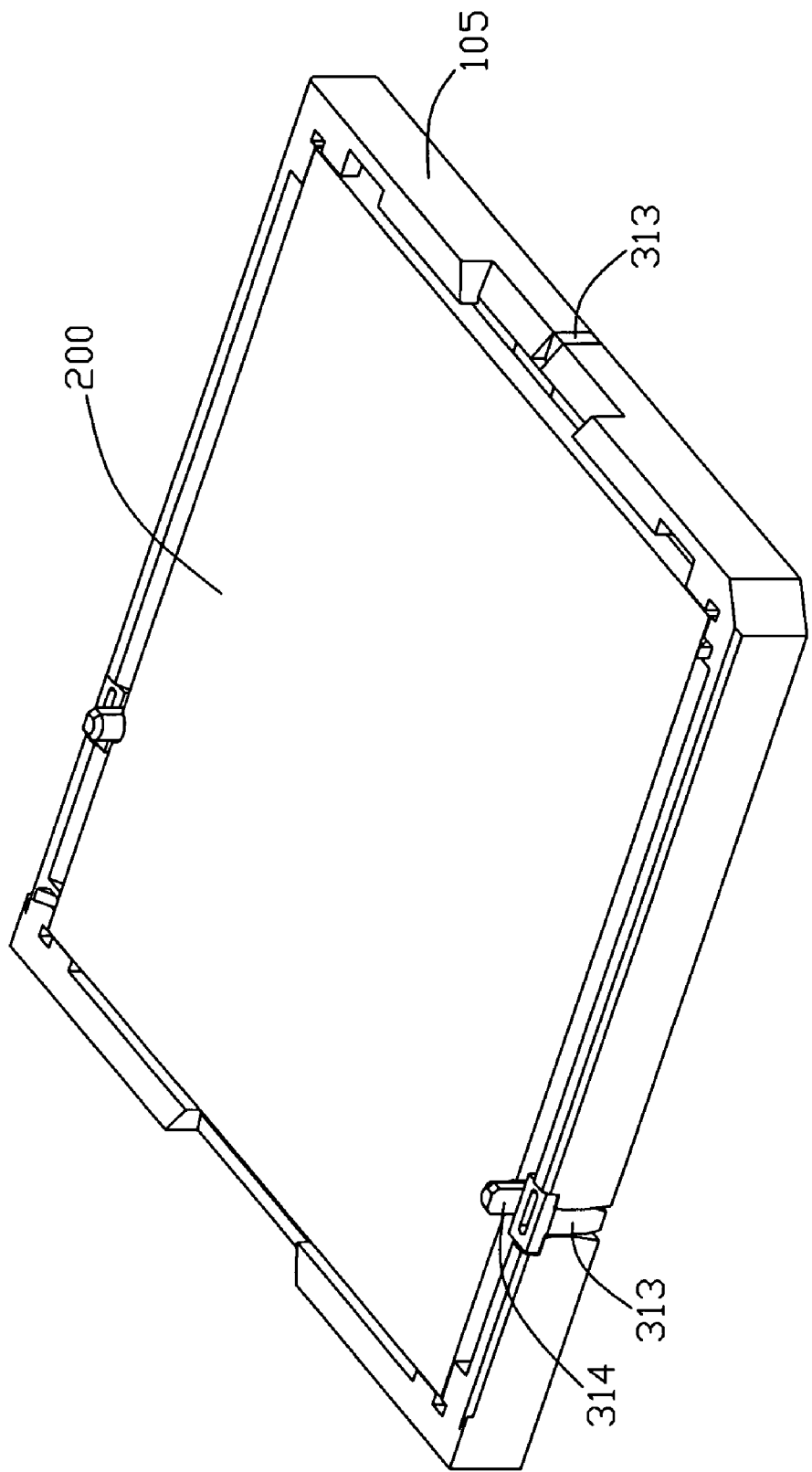
FIG. 5 is similar with FIG. 3, except that the IC package is fully inserted into the socket.

Referring to FIGS. 1 and 5, the electrical connector 100 according to the preferred embodiment of present invention for electrically connecting an IC package 200 to a printed circuit board (not shown) comprises an insulating housing 10, a plurality of terminals (not shown) received in the insulating housing 10 and a plurality of clumps 30 movably mounted to the insulating housing 10. The electrical connector 100 further has a loading mechanism (not shown) to retain the IC package 200 in the insulating housing 10, such as a loading plate.

The insulating housing 10 is in a rectangle plastic configure, and has a mating face 101 near the IC package 200, a mounting face 102 opposite to the mating face 101, a first sidewall 103 and an opposite third sidewall 105 both vertically and upwardly extending from the mating face 101, and another two opposite sidewalls: a second sidewall 104 and a fourth sidewall 106. Each of the second sidewall 104, the third sidewall 105 and the fourth sidewall 106 defines an assembling slot 110, the assembling slot 110 includes an inserting hole 1101 downwardly recessed from the mating face 101 of the insulating housing 10 and a latching hole 1102 located outside the inserting hole 1101 and inwardly recessed from an outside face of corresponding sidewall 104, 105, 106.

The clump 3 has a position block 31 and a spring member 32. The position block 31 is formed with a main body 311 located in a horizontal plane, an inserting leg 312 extending from an end of the main body 311 and a latching portion 313, the main body 311 defines a supporting face 3111 for abutting against the IC package 200. At least one of the position blocks 31 has a locating portion 314 vertically and upwardly extending from the supporting face 3111, the locating portion 314 is a semi-circle column and has a camber bearing face (not labeled). The spring member 32 may be a metal piece.

Figure 2:
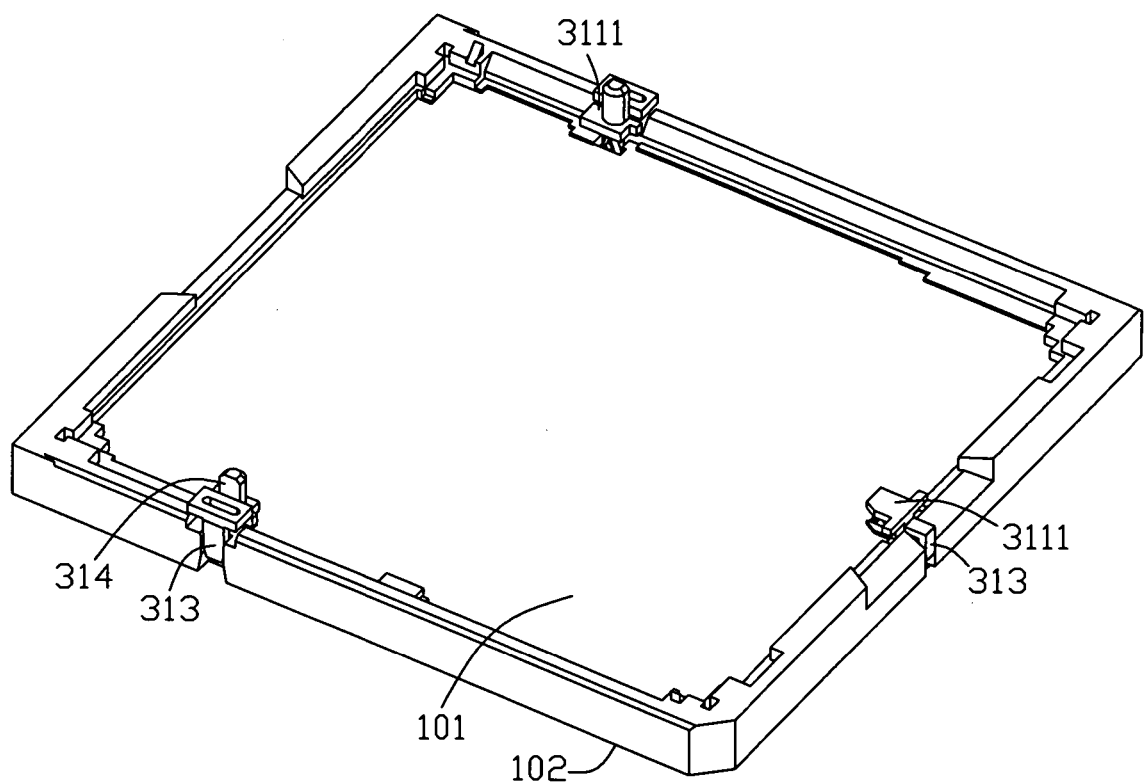
FIG. 2 is an assembled, perspective view of the socket in accordance with a preferred embodiment of present invention.

Referring to FIG. 2, showing an assembled view of the socket 100, the terminals (not shown) are received in corresponding receiving passageways (not shown) through the mating face 101 and the mounting face 102, the terminal (not shown) has a contacting arm (not shown) protruding beyond the mating face 102. The spring members 32 are inserted into and retained the inserting hole 1101 of the assembling slot 110 of the insulating housing 10, the position blocks 31 then are positioned in the assembling slots 110 of the second sidewall 104, the third sidewall 105 and the fourth sidewall 106 by the latching portions 313 latching corresponding latching holes 1102. Wherein the spring member 32 is disposed between the insulating housing 10 and the position block 31 with an end thereof abutting against a bottom surface of the main body 311 of the position block 31, and the other end thereof abutting against the insulating housing 10. Each of the position blocks 31 assembled in the second sidewall 104 and the fourth sidewall 106 has the locating portion 314, and the position block 31 assembled in the third sidewall 105 has no locating portion 314, the supporting face 3111 of the position block 31 is higher than the contacting arm (not shown) of the terminal (not shown). The spring member 32 can be compressed when being downwardly pressed by an enough force, so the position clump 30 is movable in an up-to-down direction.

Figure 3:
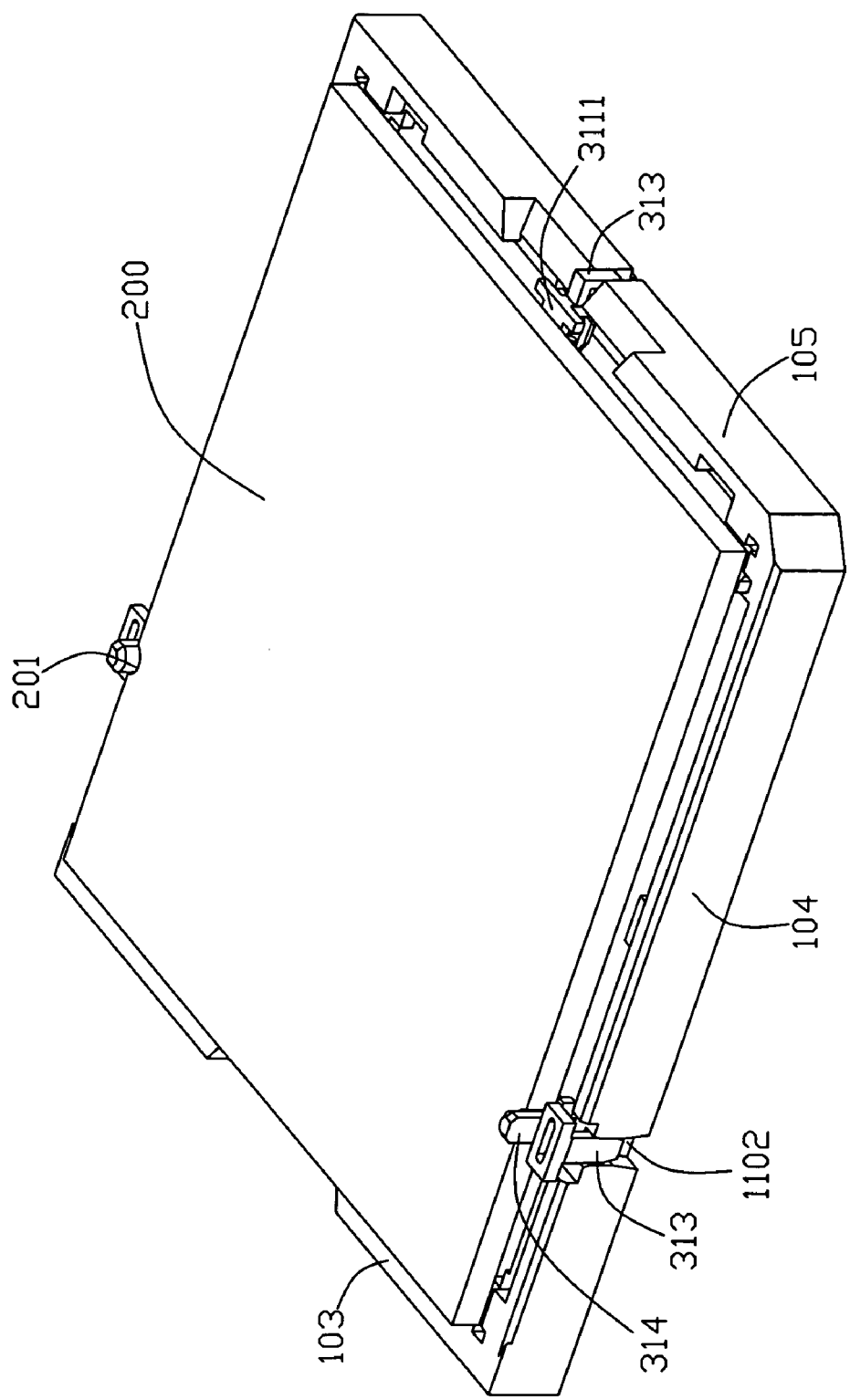
FIG. 3 is a perspective view of a socket with an IC package not fully inserted into the socket.
Figure 4:
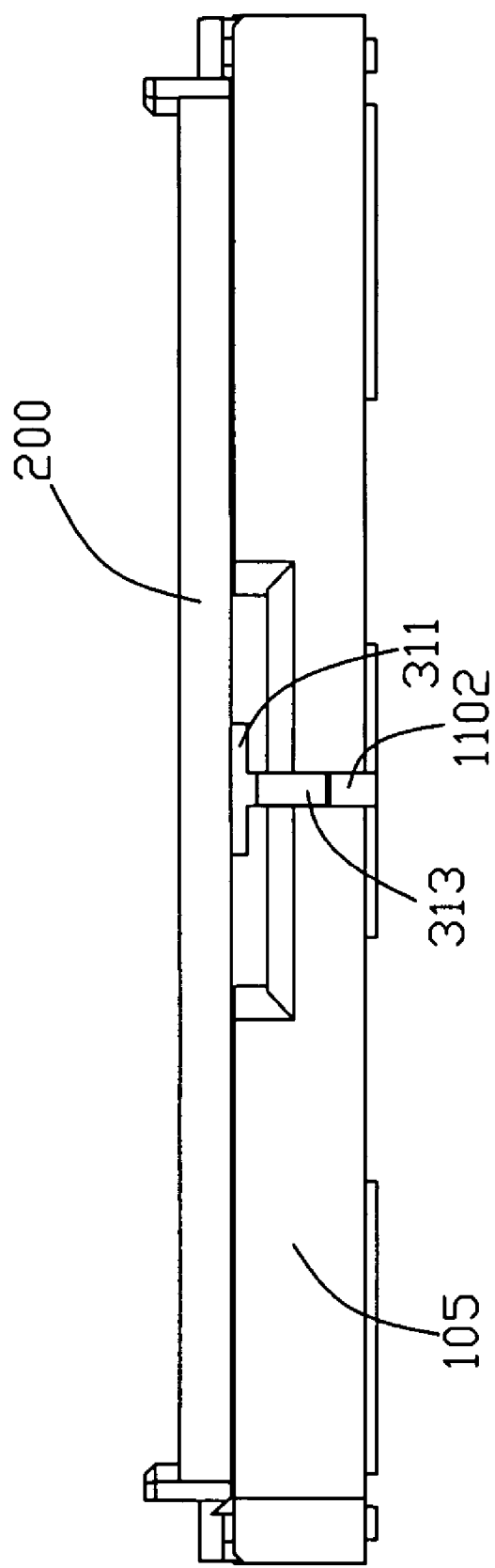
FIG. 4 is similar with the FIG. 3, but taken from another side.

FIG. 3 and FIG. 4, showing the IC package 200 mounted in the insulating housing 10 from different sides. Referring to FIG. 3, the IC package 200 seats upon the supporting face 3111 of the position block 31, the locating portions 314 of the position blocks 31 engage with cutouts 201 of the IC package 200 to make sure the IC package 200 is correctly mounted and positioned between the second sidewall 104 and the fourth sidewall 106. At this moment the IC package 200 is at a preliminary position, where the latching portion 313 of the position block 31 engages with the latching hole 1102 to retain the position block 31 in the insulating housing 10, but the IC package 200 does not contact with the contacting arm (not shown) of the terminal (not shown).

Figure 6:
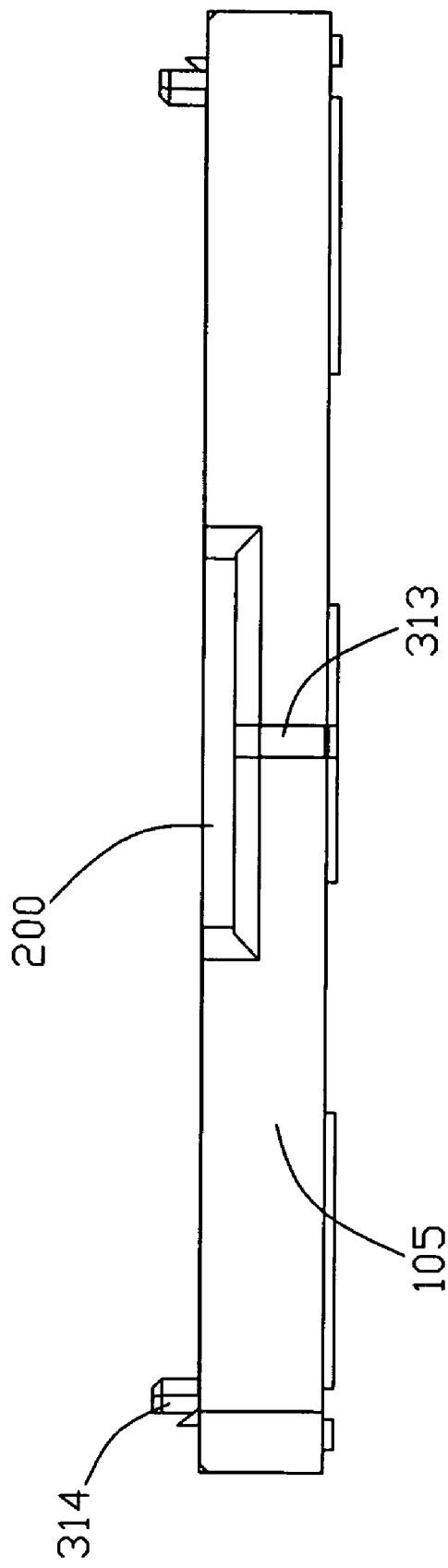
FIG. 6 is similar with the FIG. 5, but taken from another side.

Referring to FIG. 5 and FIG. 6, after the IC package 200 is located at the preliminary position, the IC package 200 is pressed downwardly by a balanced force, such as by the loading plate, and brings the position blocks 31 downwardly moving, then the inserting leg 312 slides in the inserting hole 1101, the latching portion 313 slides in the latching hole 1102, and the spring member 32 is compressed by the position block 31. Finally, the IC package 200 arrives to a final position and is retained in the insulating housing 10. When the outside force releases, the spring members 32 force the position clumps 30 upwardly move and being the IC package 200 back to the preliminary position. During this mounting process of the IC package 200, the IC package 200 always keep in a horizontal plane by supporting by the position clumps 30, so all the terminals can synchronously contact with the IC package 200 and be pressed by an equal force, that will well protect the terminals.

While the present invention has been described with reference to preferred embodiments, the description of the invention is illustrative and is not to be construed as limiting the invention. Various of modifications to the present invention, for example of up-and-down movement of the position block replaced by rotation, can be made to preferred embodiments by those skilled in the art without departing from the true spirit and scope of the invention as defined by the appended claims.

What is claimed is:

1. A socket adapted for electrically connecting a semiconductor package, comprising:
   an insulating body having a mating face, a mounting face opposite to the mating face and a plurality of sidewalls upwardly extending from the mating face, the sidewalls defining a plurality of assembling slots; and
   a plurality of separate position clumps movably assembled to the assembling slots of the insulating housing, each of the position clump having a position block and a spring member disposed between the position block and the insulating housing, the position block having a supporting face for supporting the IC package and being able to downwardly move toward the mating face by being pressed, wherein the position block has a latching portion latching with the insulating body to lock the position block to the insulating housing when the position block arrives a lower position; wherein
   the assembling slot includes an inserting hole downwardly recessed from the mating face of the insulating housing and a latching hole located outside the inserting hole and inwardly recessed from an outside face of the sidewall, the position block has an inserting leg sliding in the inserting hole of the insulating housing, and the latching portion latches with the latching hole to retain the position block to the insulating housing.

2. The socket as described in claim 1, wherein the spring member is retained in the inserting hole of the insulating housing and compressed by the position block.

3. The socket as described in claim 1, wherein at least one of the position block has a locating portion vertically and upwardly extending from the supporting face to engage with a cutout of the IC package.

4. The socket as described in claim 1, wherein the spring member is a metal piece.

5. The socket as described in claim 1, wherein the position clumps firstly support the IC package at a preliminary position, and then the position clumps together the IC package downwardly move by pressed by an outside force to bring the IC package to arrive to and be retained in a final position.

6. A socket for use with an electronic package, comprising:
   an insulative housing defining a mating face surrounded by a plurality of sidewalls to commonly define a receiving cavity for receiving said electronic package;
   a plurality of contacts disposed in the housing with contacting sections upwardly extending above the mating face in said receiving cavity; and
   at least one positioning block associated with at least one of said sidewalls and up and down movable relative to said at least one of said side walls between upper and lower positions, said at least one positioning block defining a supporting face for supporting a bottom face of said electronic package; wherein
   during loading said electronic package into the receiving cavity, said at lest one positioning block is initially located at the upper position and said electronic package initially confronts and is supported by said positioning block under a condition that said electronic package is spaced from the contacting section without engagement therebetween, and successively said electronic package is downwardly moved associatively with said at least one positioning block via a downward external force until said at least one positioning block is moved to the lower position under a condition that said electronic package is engaged with the corresponding contacting sections, the movement of said positioning block is occurred in an up-to-down direction without rotation so that the said electronic package can move downwardly evenly without tilting; wherein
   said positioning block defines a locating column inwardly and laterally facing the receiving cavity to be received in a notch of said electronic package to assure said electronic package is aligned therewith before said positioning block is moved from the upper position to the lower position; and an upper end of said locating column is higher than upper faces of the sidewalls when said positioning block is located at the upper position.

7. The socket as claimed in claim 6, wherein said housing defines an inner flange structure around the sidewalls for supporting the electronic package after said at least one positioning block is moved to the lower position.

8. The socket as claimed in claim 6, further including a spring device to urge said at least one positioning block to move upwardly once the downward external force is removed.

9. The socket as claimed in claim 6, wherein during up-and-down movement of the positioning block relative to the housing, the supporting face does not move relative to said electronic package.

10. The socket as claimed in claim 6, wherein said positioning block is equipped with a latching portion retained to the housing when said positioning block is located in the lower position.

11. The socket as claimed in claim 6, wherein said upper end of the locating column is higher than the top faces of the sidewalls when said positioning block is located at the lower position.

12. A socket assembly comprising:
   an insulative housing defining a receiving cavity surrounded by a plurality of sidewalls;
   a plurality of contacts disposed in the housing with contacting sections upwardly extending into the receiving cavity;
   one positioning block attached to one of said sidewalls in a moveable manner between upper and lower positions;
   an electronic package being downwardly loaded into the receiving cavity under a condition that said electronic package confronts said at least one positioning block without engagement with the contacting sections when said at least one positioning block is located at the upper position, and then said at least one positioning block is downwardly moved along with the downwardly moving electronic package from the upper position to the lower position to engage with the contacting sections, wherein the positioning block is moved up and down linearly; wherein
   said positioning block is equipped with a latching portion retained to the housing when said positioning block is located in the lower position.

13. The socket assembly as claimed in claim 12, further including a spring device to urge said at least one positioning block to move upwardly; wherein said positioning block defines an upward supporting face and a locating column upwardly extending from said supporting face and inwardly and laterally facing the receiving cavity under condition that said supporting face intimately upwardly confronts an underside of the electronic package and said locating column is intimately received in a corresponding notch of said electronic package, respectively.

14. The socket as claimed in claim 13, wherein during up-and-down movement of the positioning block relative to the housing between the first position and the second position, the supporting face does not move relative to said electronic package.

15. The socket as claimed in claim 13, wherein an upper end of said locating column is higher than top faces of said sidewalls when said positioning block is located in the upper position.

16. The socket as claimed in claim 15, wherein said upper end of said locating column is higher than top faces of said sidewalls when said positioning block is located in the lower position.

* * * * *